United States Patent [19]

Puumalainen et al.

[11] Patent Number: 4,543,487

[45] Date of Patent: Sep. 24, 1985

[54] PROCEDURE AND MEANS FOR CREATING AN ELECTRON CURTAIN WITH ADJUSTABLE INTENSITY DISTRIBUTION

[75] Inventors: Pertti Puumalainen, Kuopio; Rauno Rantanen, Imatra; Pertti Sikanen, Kuopio, all of Finland

[73] Assignee: Enso-Gutzeit Oy, Helsinki, Finland

[21] Appl. No.: 606,719

[22] Filed: May 3, 1984

[30] Foreign Application Priority Data

May 3, 1983 [FI] Finland ................................ 831524

[51] Int. Cl.$^{4}$ ...................... H01J 37/04; H01J 37/301

[52] U.S. Cl. .............................. 250/493.1; 250/492.1; 250/492.3

[58] Field of Search ............... 250/493.1, 492.1, 492.3, 250/396 ML, 398, 400, 423 R

[56] References Cited

U.S. PATENT DOCUMENTS 3,013,154 12/1961 Trump ................................ 250/398

3,144,552 8/1964 Schonberg et al. ............. 250/492.3

*Primary Examiner*—Alfred E. Smith

*Assistant Examiner*—Jack I. Berman

*Attorney, Agent, or Firm*—Toren, McGeady, Stanger, Goldberg & Kiel

[57] ABSTRACT

The invention concerns a procedure and a means for creating an electron curtain (5) intended to be used in irradiating a surface (8) and adjustable as to its intensity distribution. The electron curtain is elicited by producing with an elongated filament (2) placed in a chamber (1), free electrons in a space (6) surrounding the filament, by accelerating the electrons by means of an electrode structure (3) confining the space and by directing the electron curtain formed by the accelerated electrons out from the chamber through a window (4) permeable to electrons in its wall. It is a substantial novelty in the invention that regulation of the intensity distribution of the electron curtain (5) takes place by use of an elongated body (9) of magnetically soft material and of a row of magnets constituted by magnets (10) placed side by side, one of the two being disposed substantially parallelling the filament (2) behind the filament as seen from the direction of the window (4) of the chamber (1) and the other being disposed outside the window of the chamber before the electron curtain, the basis for the regulation achievable with the magnets being the absorption, dependent on the strength of the magnetic field, of electrons in the electrode structure (3). The magnets (10) being functionally independent of each other, the intensity of the electron curtain can be adjusted to be uniform or to vary as desired at different points of the curtain.

7 Claims, 2 Drawing Figures

Figure 1:
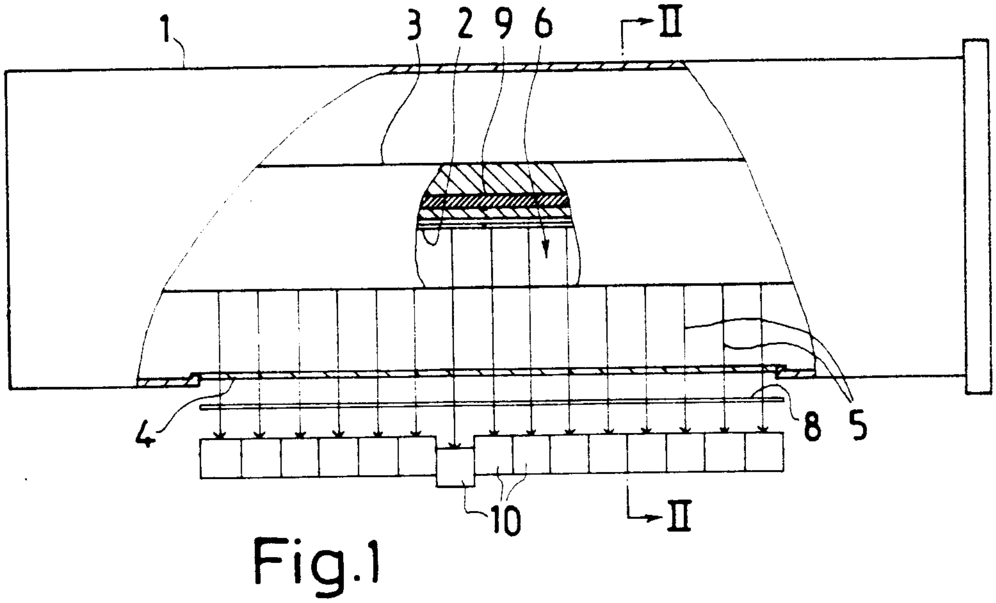

PROCEDURE AND MEANS FOR CREATING AN ELECTRON CURTAIN WITH ADJUSTABLE INTENSITY DISTRIBUTION

The present invention concerns a procedure and means for creating an electron curtain with adjustable intensity distribution, wherein with an elongated filament placed in a chamber free electrons are produced in the space surrounding the filament, the electrons are accelerated in said space by means of an electrode structure confining it, and the electron curtain constituted by the accelerated electrons is directed out from the chamber through a window permeable to electrons in its wall.

Material surfaces may be treated, for instance to the purpose of eliciting certain chemical reactions, by directing on them an electron radiation. Of the reactions that can be contemplated may be mentioned cross-linking or polymerizing of a film taking place at room temperature, and curing of coatings or laminations, and furthermore electron radiation is applicable e.g. in the sterilizing of packages.

It is known in prior art to use a focussed electron beam in irradiating extensive material surfaces. In this method, however, simultaneous irradiation of different parts of the surface is not possible: the method implies that the electron beam sweeps over the surface to be irradiated, and this implies that the requisite apparatus is comparatively complex.

It is further known in the art to perform the irradiation with the aid of a planar electron curtain, in which case the apparatus will be rather simpler. The electron curtain is produced using for electron source a lineal incandescent filament placed in a vacuum chamber, the electrons detached therefrom being accelerated with a high voltage and directed through a window in the chamber wall, permeable to electrons, to the outside of the chamber. This method has still been encumbered by the fact that since the properties of the filament vary slightly at different points of the filament, the result has been an electron curtain with non-uniform intensity distribution in the breadth direction of the curtain.

The object of the present invention is to eliminate the above-presented drawbacks associated with problem solutions of prior art and to devise a procedure by which an electron curtain can be created which has a uniform intensity distribution in the breadth direction of the curtain or where the said distribution can be regulated to be such as is desired. The procedure of the invention is characterized in that regulation of the intensity distribution of the electron curtain take place by employing an elongated body of magnetically soft material and a row of magnets constituted by magnets placed side by side, one of them placed being substantially parallelling the filament, behind the filament as viewed from the direction of the chamber window, and the other being placed outside the chamber window before the electron curtain, whereby the regulation achieved with the magnets is based on the absorption of electrons in the electrode structure, which is dependent on the strength of the magnetic field.

The procedure of the invention is essentially based on producing a magnetic field between said body of magnetically soft material and the row of magnets consisting of magnets placed side by side. The magnetic field captures the electrons emitted by the filament to travel on helical paths, the radius of these paths depending on the strength of the magnetic field. In that case electrons will be absorbed by the walls of the space formed by the electrode structure before they can enter the electric field accelerating the electrons, the number of electrons thus absorbed being controllable by the aid of the magnetic field.

By the procedure of the invention the further advantage is gained that the electron curtain is guided through the window allowing the passage of electrons in accordance with the field lines of the magnetic field, whereby the stray radiation and heating problems caused by electrons hitting the margins of the window are mitigated.

With a view to regulating in the breadth direction of the curtain the intensity distribution of the electron curtain to be produced, the magnetic field strength may be varied at different points of the means. To this purpose, the distance of each magnet from the body of magnetically soft material may be individually adjustable, or electromagnets may be alternatively used, the strength of each of which is individually controllable. It is possible in both cases to regulate the strength of the magnetic field and thereby to regulate, in the direction of the electron-emitting filament, the number of electrons which can enter the electric field so that the desired intensity distribution of the electron curtain is obtained.

The invention further concerns a means for creating an electron curtain with adjustable intensity distribution by the procedure just described. The means comprises an elongated, electron-emitting filament, an electrode structure confining the space surrounding the filament for accelerating the electrons, and a chamber in which the filament and the electrode structure have been placed and which in its wall has a window admitting the passage of electrons, through which the electron curtain can be directed, and the means is characterized in that it comprises, as members regulating the intensity distribution of the electron curtain, an elongated body made of a magnetically soft material and a row of magnets consisting of magnets placed side by side, one of the two being disposed substantially parallelling the filament, behind the filament as viewed from the direction of the chamber window, and the other being disposed outside the chamber window before the electron curtain, whereby the basis for the regulation achievable with the magnets is the absorption, dependent on the strength of the magnetic field, of the electrons emitted from the filament in the electrode structure.

The invention is described in the following in greater detail with the aid of an example, with reference to the attached drawing, wherein.

FIG. 1 presents a means according to the invention for creating an electron curtain with adjustable intensity distribution, and a film web meant to be irradiated with electrons, seen from one side of the means and partly sectioned.

Figure 2:
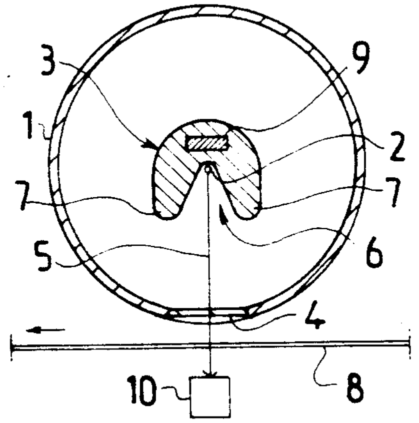

FIG. 2 shows the section II—II of FIG. 1.

In the drawing is depicted a means according to an embodiment of the invention for creating an electron curtain with adjustable intensity distribution, comprising a cylindrical vacuum chamber 1 of steel, a filament 2 parallelling the axis of the chamber and an elongated shell 3 of steel encircling the filament and constituting an electrode structure. In the wall of the chamber 1 has been provided a window *4* parallelling the axis of the chamber and allowing the passage of electrons, which consists of titanium and through which the electron curtain produced by the means is directable. The electron curtain is represented with arrows 5 in the drawing. The shell 3 encircling the filament 2 has been shaped so that the filament is located in an elongated depression 6 formed by the shell, this depression being open towards the window 4 in the chamber wall. On both margins of the depression 6, the shell 3 has been shaped to constitute an accelerating electrode 7, whereby the electrodes accelerate the electrons which have been emitted from the filament 2 and have entered the electric field between them, as a curtain toward the window 4 and further through it so that they strike the film web 8 to be irradiated, which is conveyed past the window.

To the end of regulating the intensity of the electron curtain 5 created with the means, there has been placed in the shell 3, behind the filament 2 as seen from the direction of the chamber window 4, a body 9 parallelling the filament and consisting of ferromagnetic material, which most appropriately is iron. Outside the window 4, before the electron curtain 5, has furthermore been placed a row of magnets 10 placed one beside the other, whereby between the body 9 and the row of magnets can be produced a magnetic field. With a view to regulating the strength of the magnetic field, the distance of each magnet 10 from the electron-emitting filament 2 can be independently adjusted, and in FIG. 1 a situation is seen in which one of the magnets has been placed slightly farther away from the filament than the others. Alternatively, regulation of the magnetic field strength may be accomplished by regulating the magnetizing current of the magnets 10.

Generation of the electron curtain 5 with the means just presented takes place in that to the shell 3 is applied a negative voltage of a few hundred kV referred to the wall of the chamber 1 and a magnetic field is established between the body 9 and the magnets 10. The electrons emitted from the filament 2 are then forced in the depression 6 on helical paths, whereby part of them are absorbed in the walls of the depression, and part of them gain entrance in the electric field between the accelerating electrodes 7. The porportion of absorbed electrons of the number of electrons emitted by the filament 2 depends on the strength of the magnetic field acting at different points of the means. The accelerating electrodes 7 accelerate those electrons which have entered the electric field, towards the window 4 in the chamber wall 1, in the form of a curtain 5, which after passing through the window strikes the film web 8 to be irradiated, which is conveyed through between the window and the magnets 10. Since the walls of the chamber 1 consist of a magnetically hard material, the magnetic field promotes the focussing of the electron curtain 5 on the window 4 so that there will be little, if any, stray radiation interfering with the proper functioning of the means.

When in the case depicted in FIG. 1 one of the magnets 10 has been taken farther away from the filament than the other magnets, this implies that the magnetic field line density has been reduced at this point and the electrons are forced in the depression 6 on helical paths with a larger radius. The consequence is increased absorption of electrons by the walls of the electrode structure 3 and a lower intensity of the electron curtain at this point, compared with the other points of the means.

It is obvious to a person skilled in the art that different embodiments of the invention are not confined to the example presented and may instead vary within the scope of the claims following below.

We claim:

1. Procedure for creating an electron curtain with adjustable intensity distribution, wherein by means of an elongated filament placed in a chamber are produced free electrons in a space surrounding the filament, the electrons are accelerated in said space by means of an electrode structure confining it, and the electron curtain constituted by the accelerated electrons is directed out from the chamber through a window permeable to electrons in its wall, and wherein regulation of the intensity distribution of the electron curtain takes place by use of an elongated body of magnetically soft material and of a row of magnets constituted by magnets placed side by side, one of the two being disposed substantially parallelling the filament behind the filament as seen from the direction of the window of the chamber and the other being disposed outside the window of the chamber before the electron curtain, the basis for the regulation achievable with the magnets being the absorption, dependent on the strength of the magnetic field, of electrons in the electrode structure.

2. Procedure according to claim 1, wherein regulation takes place by adjusting the distances between different magnets in the row and the body of magnetically soft material.

3. Procedure according to claim 1, wherein for magnets are used electromagnets and regulation takes place by adjusting the electric current intensities of different magnets in the row.

4. A means for creating an electron curtain with adjustable intensity distribution, said means comprising an elongated, electron-emitting filament, an electrode structure for accelerating the electrons and surrounding a space, and a chamber in which the filament and the electrode structure have been placed and which has in its wall a window permeable to electrons and through which the electron curtain can be directed, and said means further comprising as members regulating the intensity distribution of the electron curtain, an elongated body of magnetically soft material and a row of magnets constituted by magnets placed side by side, one of the two being disposed substantially parallelling the filament and behind the filament as seen from the direction of the window of the chamber and the other being disposed outside the window of the chamber before the electron curtain, the basis for the regulation achievable with the magnets being absorption, dependent on the strength of the magnetic field, of electrons emitted from the filament in the electrode structure.

5. Means according to claim 4, wherein the distance of each magnet in the row from the body of magnetically soft material is independently adjustable.

6. Means according to claim 4, wherein the magnets are electromagnets, in each of them the electric current intensity being independently adjustable.

7. Means according to claim 4, wherein the wall of the chamber consists of magnetically hard material.

* * * * *